(12) United States Patent
Liu (10) Patent No.: US 8,168,473 B2
(45) Date of Patent: *May 1, 2012

(54) MOLDED ULTRA THIN SEMICONDUCTOR DIE PACKAGES, SYSTEMS USING THE SAME, AND METHODS OF MAKING THE SAME

(75) Inventor: Yong Liu, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/940,319

(22) Filed: Nov. 5, 2010

(65) Prior Publication Data
US 2011/0059582 A1   Mar. 10, 2011

Related U.S. Application Data

(62) Division of application No. 12/200,819, filed on Aug. 28, 2008, now Pat. No. 7,855,439.

(51) Int. Cl.
*H01L 21/00* (2006.01)
(52) U.S. Cl. ......................................... 438/110; 438/127
(58) Field of Classification Search .................. None
See application file for complete search history.

(56) References Cited

U.S. PATENT DOCUMENTS

| | | | | |
|---|---|---|---|---|
| 4,736,236 A | * | 4/1988 | Butt | 257/672 |
| 6,486,545 B1 | * | 11/2002 | Glenn et al. | 257/686 |
| 6,734,534 B1 | * | 5/2004 | Vu et al. | 257/668 |
| 6,819,003 B2 | * | 11/2004 | Farnworth | 257/787 |
| 6,943,450 B2 | * | 9/2005 | Fee et al. | 257/773 |
| 7,855,439 B2 | * | 12/2010 | Liu | 257/666 |
| 2003/0143776 A1 | | 7/2003 | Pedron et al. | |
| 2006/0087044 A1 | * | 4/2006 | Goller | 257/783 |
| 2006/0290010 A1 | * | 12/2006 | Hsu | 257/787 |
| 2008/0197478 A1 | | 8/2008 | Yang et al. | |
| 2009/0039491 A1 | * | 2/2009 | Kim et al. | 257/686 |
| 2009/0051031 A1 | * | 2/2009 | Lai et al. | 257/738 |
| 2009/0140394 A1 | * | 6/2009 | Bathan et al. | 257/621 |
| 2009/0243082 A1 | * | 10/2009 | Camacho et al. | 257/694 |
| 2009/0267171 A1 | * | 10/2009 | Yean et al. | 257/434 |

OTHER PUBLICATIONS

International Search Report and Written Opinion of the International Searching Authority for PCT Application No. PCT/US2009/052707, mailed Mar. 10, 2011, 6 pages.

* cited by examiner

*Primary Examiner* — Scott B Geyer
(74) *Attorney, Agent, or Firm* — Kilpatrick Townsend & Stockton LLP

(57) ABSTRACT

Disclosed are molded ultra-thin semiconductor die packages, systems that incorporate such packages, and methods of making such packages. An exemplary package comprises a leadframe having an aperture formed between the leadframe's first and second surfaces, and a plurality of leads disposed adjacent to the aperture. The package further comprises a semiconductor disposed in the aperture of the leadframe with its top surface substantially flush with the leadframe's first surface, and at least one gap between at least one side surface of the semiconductor die and at least one lead of the leadframe. A body of electrically insulating material is disposed in the at least one gap. A plurality of conductive members interconnect leads of the leadframe with conductive regions on the die's top surface, with at least one conductive member having a portion disposed over at least a portion of the body of insulating material.

14 Claims, 7 Drawing Sheets

MOLDED ULTRA THIN SEMICONDUCTOR DIE PACKAGES, SYSTEMS USING THE SAME, AND METHODS OF MAKING THE SAME

CROSS-REFERENCES TO RELATED APPLICATIONS

This Application is a divisional application of U.S. patent application Ser. No. 12/200,819, filed Aug. 28, 2008, now U.S. Pat. No. 7,855,439, and which is incorporated herein by reference in its entirety for all purposes.

BACKGROUND OF THE INVENTION

Personal portable electronic products, such as cell phones, personal data assistants, digital cameras, laptops, etc., are generally comprised of several packaged semiconductor IC chips and surface mount components assembled onto interconnect substrates, such as printed circuit boards and flex substrates. There is an ever increasing demand to incorporate more functionality and features into personal portable electronic products, while at the same time shrink the sizes of such devices. This, in turn, has placed ever increasing demands on the design, size, and assembly of the interconnect substrates. As the number of assembled components increases, substrate areas and costs increase, while demand for a smaller form factor increases.

BRIEF SUMMARY OF THE INVENTION

As part of making his invention, the inventor has recognized that there is a need to address these issues and that it would be advantageous to find ways to enable increases in functionality and features of electronic products without causing increases in substrate areas and costs, and decreases in product yields. As also part of making his invention, the inventor has recognized that many electronic products have several components, particularly semiconductor die, that can be grouped together in several small groups that provide specific functions. As also part of making his invention, the inventor has discovered that the substrate area required for a circuit group can be significantly decreased by packaging semiconductor die and other components in molded ultra-thin packages that can be stacked on top of one another to reduce board space and increase functionality, where each such package may be as thin as the semiconductor die it houses.

Accordingly, a first general embodiment according to the invention is directed to a semiconductor die package broadly comprising a leadframe having a first surface, a second surface, an aperture disposed between the leadframe's first and second surfaces, and a plurality of leads disposed adjacent to the aperture. The semiconductor die package further comprises a semiconductor die having a top surface, a bottom surface, at least one side surface between its top and bottom surfaces, and a plurality of conductive regions disposed on the semiconductor die's top surface. The semiconductor die is disposed in the aperture of the leadframe with its top surface substantially flush with the first surface of the leadframe. The package further comprises at least one gap between the at least one side surface of the semiconductor die and at least one lead of the leadframe, and a body of electrically insulating material disposed in at least a portion of the at least one gap. The package further comprises a plurality of conductive members, each conductive member having a first end electrically coupled to a conductive region of the semiconductor die and a second end electrically coupled to a lead of the leadframe. At least one conductive member has a portion disposed over at least a portion of the body of electrically insulating material.

With this exemplary construction, the semiconductor die package may be as thin as the semiconductor die it houses, with signals to and from the die being conveyed by the leads and conductive members, which may comprise deposited conductive layers or low height wire bonds, such as wedge wire bonds. Packages having a common lead pattern may be stacked upon one another to electrically interconnect several semiconductor die to provide increased functionality within the area footprint of a single semiconductor die package. The layout of the conductive members among the packages may be varied to provide a desired interconnect among the stacked semiconductor dice. As another benefit of this exemplary embodiment of the present invention, semiconductor dice having the same circuit or components may be stacked and electrically coupled in parallel to provide additional performance within the footprint of a single package, as opposed to using a large device packaged in a larger footprint package. For example, small-scale power-switching MOSFET transistors on individual dice may be housed in similar packages having the same small footprint, and may be stacked and electrically coupled in parallel to provide the power-handling performance of a much larger MOSFET device housed in a larger footprint package.

Another general embodiment according to the invention is directed to a method of manufacturing a semiconductor die package for one or more semiconductor dice. Each semiconductor die has a front surface with a plurality of conductive regions and a back surface. The method broadly comprises constructing an assembly that has at least one semiconductor die disposed on a carrier film with its active surface facing the carrier film, a plurality of leads disposed adjacent to the semiconductor die, and at least one gap between the semiconductor die and at least one lead. The method further comprises disposing a body of an electrically insulating material within the at least one gap such that the body solidifies and adheres to the semiconductor die and the at least one lead. Conductive members are assembled with the die and leads of the leadframe to provide electrical couplings between conductive regions of the die and the leads. The conductive members may be assembled when constructing the assembly, such as by disposing the conductive members on the carrier film prior to assembling the die, or may be assembled afterwards. In the latter case, the carrier film may be removed, and the conductive members may be disposed on the first surfaces of die and leadframe.

The present invention also encompasses systems that include packages according to the present invention, each such system having an interconnect substrate and a semiconductor die package according to the present invention attached to the interconnect substrate, with electrical connections made therewith.

The above general embodiments and other embodiments of the invention are described in the Detailed Description with reference to the Figures. In the Figures, like numerals may reference like elements and descriptions of some elements may not be repeated.

DETAILED DESCRIPTION OF THE INVENTION

The present invention will be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to one skilled in the art. In the drawings, the thicknesses of layers and regions may be exaggerated for clarity. The same reference numerals are used to denote the same elements throughout the specification. The elements may have different interrelationships and different positions for different embodiments.

It will also be understood that when a layer is referred to as being "on" another layer or substrate, it can be directly on the other layer or substrate, or intervening layers may also be present. In the drawings, the thicknesses and sizes of layers and regions are exaggerated for clarity, and like reference numerals in the drawings denote like elements. It will also be understood that when an element, such as a layer, a region, or a substrate, is referred to as being "on," "connected to," "electrically connected to," "coupled to," or "electrically coupled to" another element, it may be directly on, connected or coupled to the other element, or one or more intervening elements may be present. In contrast, when an element is referred to as being "directly on," "directly connected to" or "directly coupled to" another element or layer, there are no intervening elements or layers present. The term "and/or" used herein includes any and all combinations of one or more of the associated listed items.

The terms used herein are for illustrative purposes of the present invention only and should not be construed to limit the meaning or the scope of the present invention. As used in this specification, a singular form may, unless definitely indicating a particular case in terms of the context, include a plural form. Also, the expressions "comprise" and/or "comprising" used in this specification neither define the mentioned shapes, numbers, steps, actions, operations, members, elements, and/or groups of these, nor exclude the presence or addition of one or more other different shapes, numbers, steps, operations, members, elements, and/or groups of these, or addition of these. Spatially relative terms, such as "over," "above," "upper," "under," "beneath," "below," "lower," and the like, may be used herein for ease of description to describe one element or feature's relationship to another element(s) or feature(s) as illustrated in the figures. It will be understood that the spatially relative terms are intended to encompass different orientations of the device (e.g., package) in use or operation in addition to the orientation depicted in the figures. For example, if the device in the figures is turned over, elements described as "below" or "beneath" or "under" other elements or features would then be oriented "over" or "above" the other elements or features. Thus, the exemplary term "above" may encompass both an above and below orientation.

As used herein, terms such as "first," "second," etc. are used to describe various members, components, regions, layers, and/or portions. However, it is obvious that the members, components, regions, layers, and/or portions should not be defined by these terms. The terms are used only for distinguishing one member, component, region, layer, or portion from another member, component, region, layer, or portion. Thus, a first member, component, region, layer, or portion which will be described may also refer to a second member, component, region, layer, or portion, without departing from the scope of the present invention.

Figure 1:
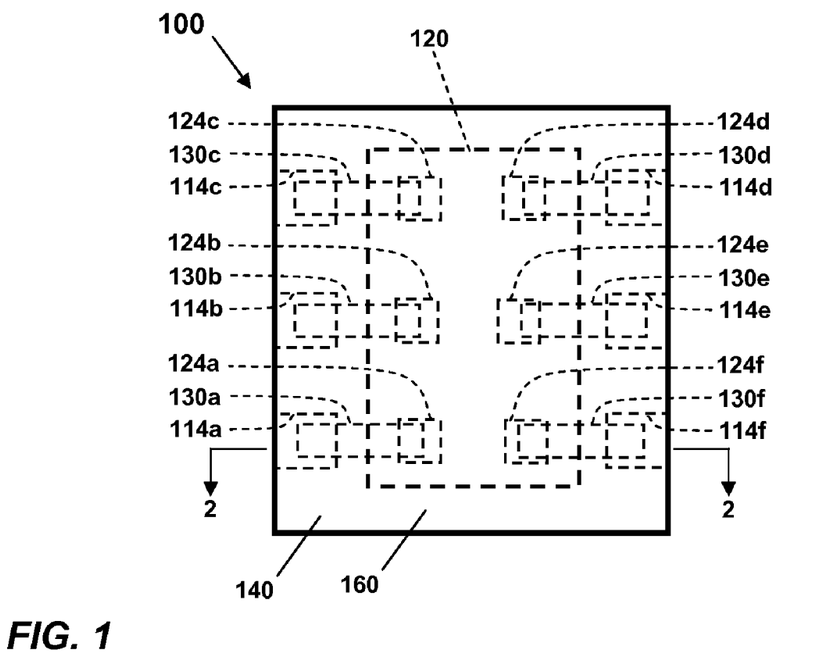
FIG. 1 is a top plan view of a first embodiment of a semiconductor die package according to the present invention.
Figure 2:
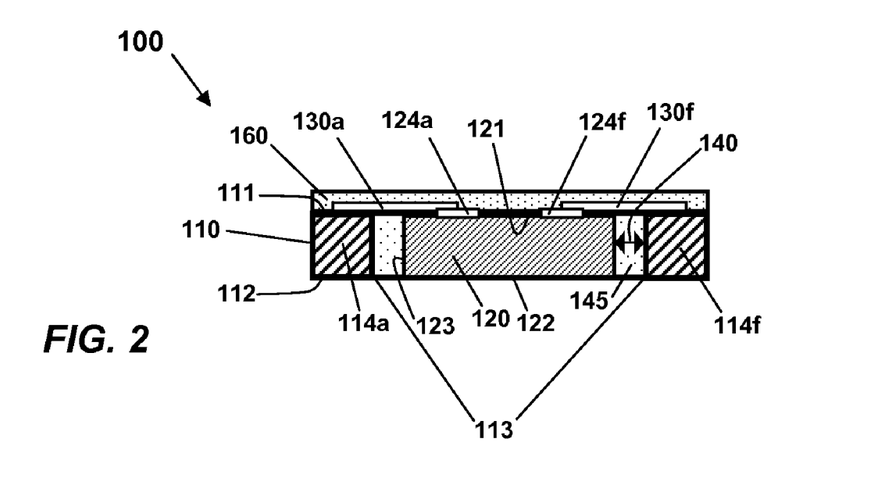
FIG. 2 is a cross-sectional view of the first embodiment of a semiconductor die package according to the present invention.

FIG. 1 is a top plan view of a first embodiment 100 of a semiconductor die package according to the present invention, and FIG. 2 is a cross-sectional view thereof taken along the line 2-2 shown in FIG. 1. Referring to both FIGS. 1 and 2, semiconductor die package 100 comprises a leadframe 110 having a first surface 111, a second surface 112, an aperture 113 disposed between the leadframe's first and second surfaces, and a plurality of leads 114a-114f disposed adjacent to aperture 113. Package 100 further comprises a semiconductor die 120 having a top surface 121, a bottom surface 122, one or more side surfaces 123 between the top and bottom surfaces, and a plurality of conductive regions 124a-124f disposed on the die's top surface 121. Semiconductor die 120 typically has four side surfaces. (In very rare instances it may have a circular shape with only one side surface, or a triangular shape with three side surfaces.) The die's top surface 121 is often referred to as its active surface since the conductive regions 124 are disposed on it, and since the majority of the electronic components are formed on it. Semiconductor die 120 is disposed in the leadframe's aperture 113 with its top surface 121 substantially flush with the leadframe's first surface 111. To be substantially flush, the difference in heights between surfaces 121 and 111 is not more than 50 microns. The difference is typically not more than 25 microns, and preferably not more than 10 percent of the thickness of semiconductor die 120 (which would be not more than 10 microns for die having a 100 micron thickness). The bottom surface 122 of die 120 is preferably substantially flush with the leadframe's second surface 112 or below the level of the leadframe's second surface 112, but may be above the level of second surface 122. To be substantially flush, the difference in heights between surfaces 122 and 112 is not more than 50 microns. In typical embodiments, the bottom surface 122 of die 120 is not more than 25 microns above the leadframe's second surface 112.

Package 100 further comprises at least one gap 140 disposed between at least one side surface 123 of semiconductor die 120 and at least one lead 114 of leadframe 110. Typically, die 120 is disposed substantially in the middle of aperture 113 and leads 114, and gap 140 encircles die 120. However, die 120 can be positioned to abut a row of leads, in which case the gap surrounds three sides of the die. In another example, the leads 114 may be distributed around all four sides of die 120 to provide a rectangular aperture, and the die may be positioned to abut a corner of the aperture. In this case, the gap would surround two sides of the die. In a further implementation of the rectangular aperture example, the die and leadframe may have precision dimensions, and two opposing side surfaces of the die may abut two opposing rows of leads, providing two gaps between the other two opposing side surfaces of the die and the other two opposing rows of leads.

Package 100 further comprises a body 145 of electrically insulating material disposed in at least a portion of gap 140, and is preferably disposed in substantially all of gap 140. Bodies of electrically insulating material may also be disposed in the gaps between the leads 114a-114f. Body 145 is preferably disposed in gap 140 in a liquid state, and thereafter solidified, such as by application of a thermal treatment (such as heating before or after deposition), ultra-violet light treatment, and/or a chemical treatment (e.g., chemical reaction). Body 145 preferably has adhesive properties that enable it to mechanically adhere to the sides 123 of semiconductor die 120 and the side surfaces of leads 114a-114f after it is solidified. Body 145 may comprise an epoxy (such as an epoxy molding compound), a silicone, and/or a polyimide (i.e., it may comprise one or more of these materials). Body 145 is preferably formed so that it has a top surface that is substantially flush with the die's top surface 121 and the leadframe's first surface 111, and a bottom surface that is substantially flush with one or both of the die's bottom surface 122 and the leadframe's second surface 112. To be substantially flush, the difference in heights is not more than 50 microns. Typically, the difference in heights is not more than 25 microns.

Package 100 further comprises a plurality of conductive members 130a-130f, each conductive member 130 having a first end electrically coupled to a conductive region 124 of semiconductor die 120 and a second end electrically coupled to a lead 114 of leadframe 110. A conductive member 130 typically has a portion disposed over at least a portion of body 145 of electrically insulating material. Each of conductive members 130a-130f may comprise conductive layers (e.g., metal layers) that are formed by conventional deposition methods on the surface collectively provided by leadframe 110, die 120, and body 145. Their thicknesses typically range between 2 microns to 20 microns. Each of the conductive members 130a-130f may also comprise a substantially flat wire bond or substantially flat ribbon bond, with one end wedge bonded to a lead 114 of leadframe 110 and the other end wedge bonded to a conductive region 124 of die 120, with minimum slack between wedge bonds (e.g., a so-called "no height" loop). The thicknesses of such flat wire bonds typically range between 25 microns (~1 mil) to 100 microns (~4 mils).

Package 100 further comprises a layer 160 of electrically insulating material disposed on conductive members 130a-130f and on the surface provided by leadframe 110, die 120, and body 145. Layer 160 may comprise polyimide, epoxy, silicone, benzocyclobutene (BCB), or the like, and may be disposed by printing (e.g., screen-printing), by film application, or by other conventional methods. Insulating layer 160 protects the conductive members 130a-130f and the top surface 121 of die 120, electrically insulates these elements, and retards corrosion of these elements. Layer 160 may be omitted from areas that overlie leads 114a-114f, which enables instances of package 100 to be stacked on top of one another, with their leads being electrically coupled by bodies of solder material (as illustrated below). In such stacking arrangements, layer 160 electrically insulates the semiconductor dice from one another. Layer 160 may have a thickness in the range of 10 microns to 110 microns. The maximum number of 110 microns for layer 160 is related to the maximum height of 100 microns for flat wedge bonds.

With this construction, packages can be made with thicknesses that are substantially the same as the thickness of the die, thereby providing ultra-thin semiconductor die packages. For example, with a die thickness of 100 microns, the package may be made as thin as approximately 110 microns to 120 microns. For a die thickness of 250 microns, the package may be made as thin as approximately 260 microns to 300 microns. The ultra thin package provides excellent thermal performance by minimizing the distance between the die and an external heat sink, and provides excellent electrical characteristics by minimizing interconnect distances and lead distances. Moreover, leads 114a-114f may be configured so that their outer portions conform to industry standard pin outs. The leads 114 and/or the conductive members 130 may also be fanned outward from the die (such as for small die) to redistribute the chip's interconnect pads to an industry standard pattern. All of these features make package 100 an excellent choice for use in portable devices and devices that need ultra thin components.

Figure 3:
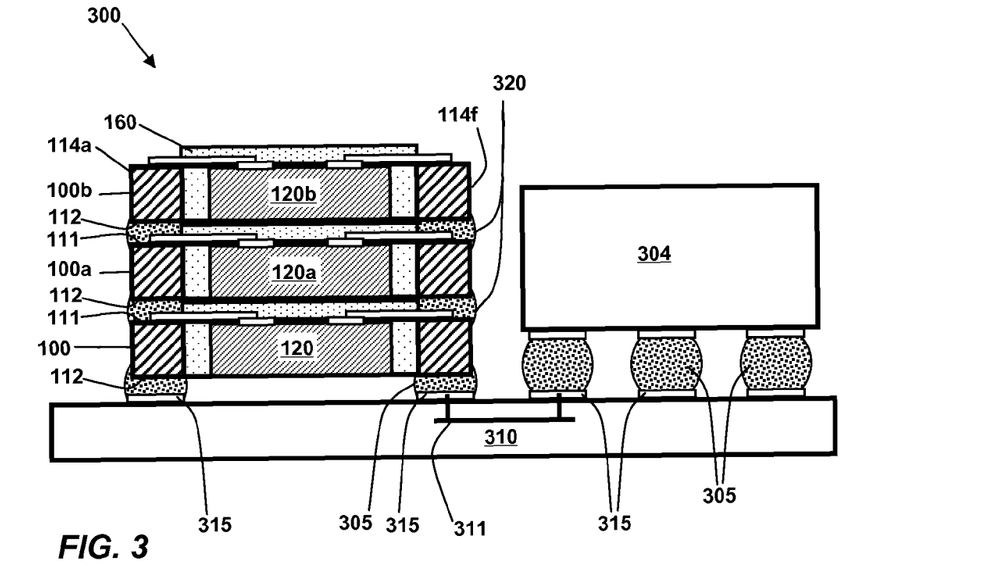
FIG. 3 is a cross-sectional view of an exemplary system that comprises semiconductor die packages according to the present invention.

In addition to the above, multiple instances of package 100 may be stacked upon one another to provide increased circuit functionality and/or performance within a given footprint of board area. FIG. 3 is a cross-sectional view of an exemplary system 300 that comprises an interconnect board 310 having a plurality of electrical interconnect pads 315, semiconductor die package 100 disposed on the top surface interconnect board 310 (with its second surface 112 facing board 310), a second semiconductor die package 100a disposed over package 100, and a third semiconductor die package 100b disposed over the second package 100a. The leads 114 of semiconductor die package 100 are electrically coupled to respective pads 315 by corresponding bodies 305 of electrically conductive adhesive, which may comprise a solder, an electrically-conductive polymer, etc. System 300 also comprises an electrical package 304 that is also electrically coupled to respective pads 315 by adhesive bodies 305. Package 304 may comprise a passive electronic component, or may comprise a semiconductor die package having the same construction as package 100, or a different construction, and may be electrically coupled to package 100 by one or more electrical traces 311 disposed in or on interconnect substrate 310. Package 100 may be mounted so that its second surface 112 faces interconnect substrate 310, as shown in FIG. 3, or may be mounted so that its first surface 111 faces interconnect substrate 310. In the former case, the back surface of die 120 may be electrically coupled to a pad 315 of substrate 310 by an adhesive body 305 (not shown) to make an electrical connect or to enhance cooling of the die. In the latter case, when package 100 is in the opposite orientation, portions of layer 160 over the leads 114 are preferably removed. However, the removal may not be necessary since solder adhesive bodies 305 can be adhered to the side surfaces of the leads 114 (although this increases the effective footprint of the package).

Packages 100a and 120b comprise substantially the same construction as package 100, and comprise respective semiconductor die 120a and 120b that may have same components and circuits as die 120, or may have different components and circuits. The conductive members 130 of packages 100a and 100b may have the same configuration and layout as the conductive members 130 of package 100, or may have different configurations and layouts. The second surface 112 of second package 100a may be disposed over first package 100, and the portions of its leads 114 at its second surface 112 may be electrically coupled to respective leads 114 of package 100 by bodies 320 of electrically conductive adhesive. Adhesive bodies 320 may comprise a solder, an electrically-conductive polymer, etc. Second package 100a may also have the opposite orientation, where its first surface 111 may be disposed over first package 100 and the portions of its leads 114 at its first surface 111 may be electrically coupled to respective leads 114 of package 100 by adhesive bodies 320. In this case, it is preferable to remove portions of layer 160 over the leads 114 of second package 110a.

In a similar manner, the second surface 112 of third package 100b may be disposed over the first surface 111 of second package 100a, and the portions of its leads 114 at its second surface 112 may be electrically coupled to respective leads 114 of second package 100a by bodies 320 of electrically conductive adhesive. Third package 100b may also have the opposite orientation, where its first surface 111 may be disposed over second package 100b and the portions of its leads 114 at its first surface 111 may be electrically coupled to respective leads 114 of second package 100a by adhesive bodies 320. In this case, it is preferable to remove portions of layer 160 over the leads 114 of third package 110b.

Figure 4:
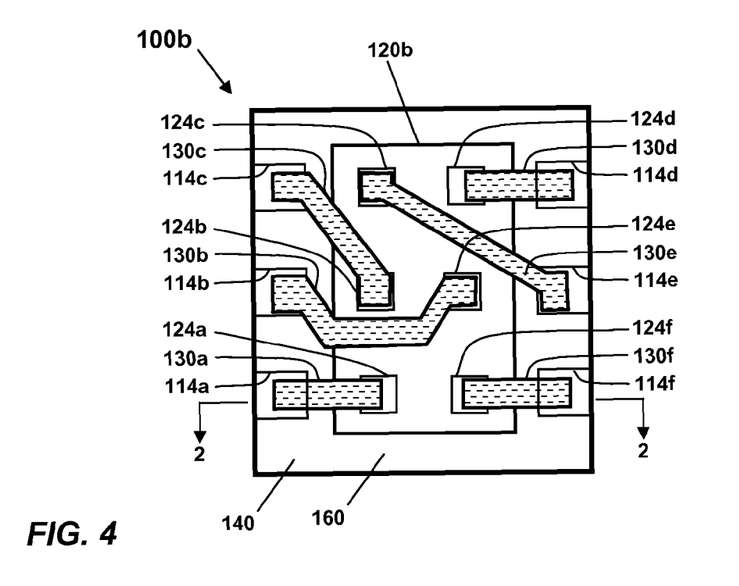
FIG. 4 is a top plan view of an exemplary layout of conductive members according to the present invention.

Packages 100, 100a, and 100b may have identical circuits (and semiconductor dice), in which case their respective circuits are electrically coupled in parallel. The parallel interconnection can provide increased circuit performance within the footprint of package 100, such as by increasing the current handling capability of a power-handling circuit. As another possibility, two of the packages may have identical circuits and may include power-handling devices, while the third package has a different circuit, such as a control circuit for controlling the power handling devices in the other two packages. This configuration may be used to increase circuit performance and functionality within the footprint of package 100. As yet another possibility, all three packages may have different circuits. This configuration may be used to increase circuit functionality within the footprint of package 100. To facilitate the stacking interconnection of different packages, the layout of conductive members 130 for a package may be altered from the layout shown in FIG. 2. An example of such an altered layout is shown in FIG. 4 for third package 100b. Packages 100 and 100a may also have altered layouts, which may be different from that shown in FIG. 4.

Packages 100, 100a, and 100b may be assembled together before being assembled onto interconnect substrate 310, in which case adhesive bodies 320 may have a reflow temperature that is higher than that of adhesive bodies 305. As another approach, package 100 may be assembled onto substrate 310 first, followed by the assembly of packages 100a and 100b onto package 100. In this case, adhesive bodies 320 may have a reflow temperature that is lower than that of adhesive bodies 305. Packages 100, 100a, and 100b may be sold separately, or may be sold in assembled form, such as shown in FIG. 3.

Figure 5:
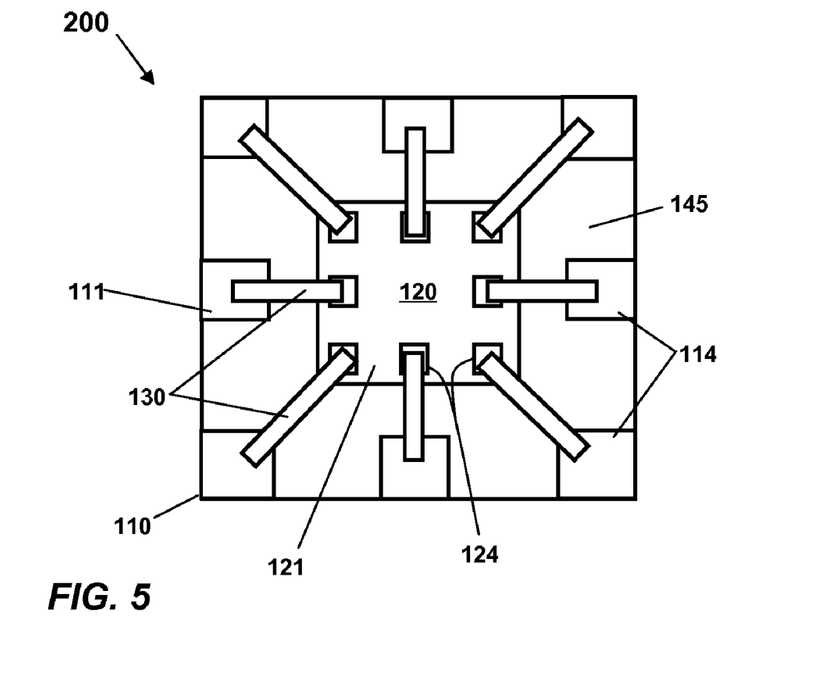
FIG. 5 is a top plan view of another exemplary layout of conductive members according to the present invention.
Figure 6:
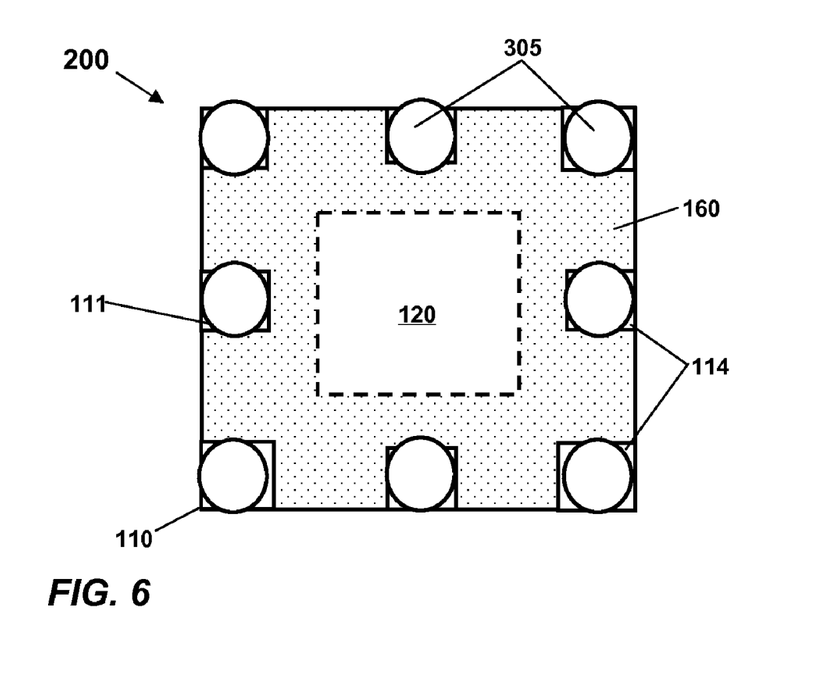
FIG. 6 is a bottom plan view of an exemplary package showing a ball grid array disposed on an exemplary package according to the present invention.

As previously mentioned above, the leads 114 and/or the conductive members 130 of a semiconductor package may also be fanned outward from the die (such as for small die) to redistribute the chip's interconnect pads to an industry standard pattern. This fanout is shown by package 200 in FIG. 5. Such fanout may also be used to enable the use of a ball-grid array at either surface of the package, as illustrated in FIG. 6.

Figure 7:
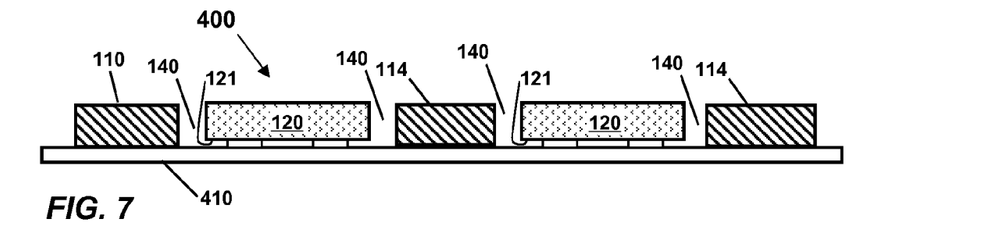
FIGS. 7-18 show views of package assemblies during various stages of fabrication according to exemplary embodiments of the present invention.
Figure 8:
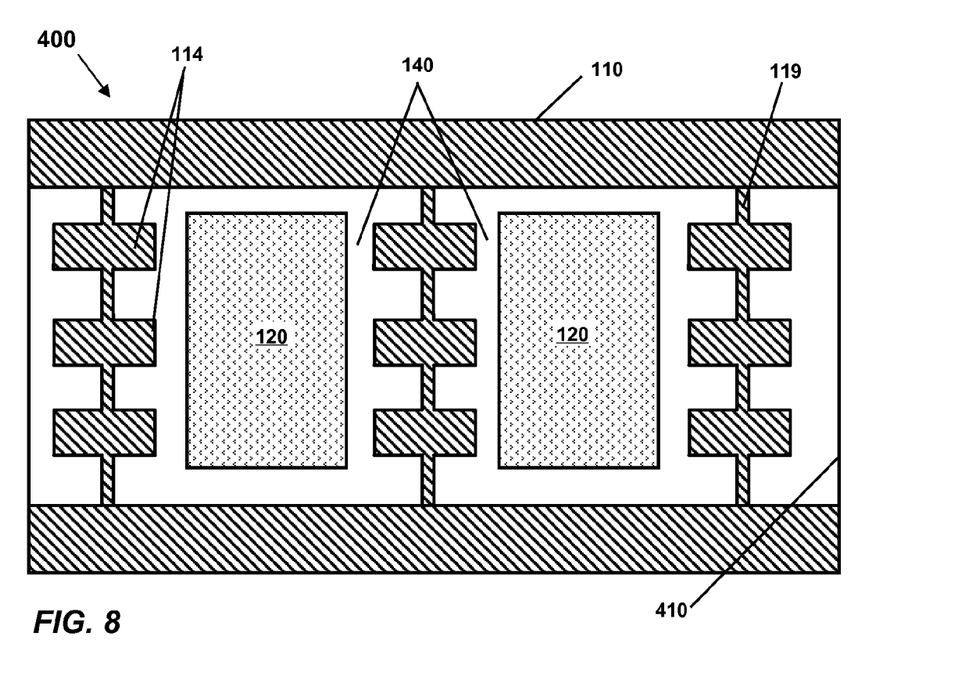

FIGS. 7-11 illustrate an exemplary method of making packages 100, 100a, and 100b. Referring to FIGS. 7 and 8, an exemplary method comprises constructing an assembly 400 that has at least one semiconductor die 120 disposed on a carrier film 410 with its active surface 121 facing the carrier film 410, a plurality of leads 114 disposed adjacent to the semiconductor die 120, and at least one gap 140 between the semiconductor die 120 and at least one lead 114. FIG. 7 shows a side view of assembly 400, while FIG. 8 shows a top plan view. Leads 114 are preferably provided together in a leadframe 110, and are temporarily connected together by tie bars 119 (shown in FIG. 8). Assembly 400 may be constructed by assembling leadframe 110 with carrier film 410, and thereafter assembling semiconductor die 120 on to carrier film 410. Typically, each of leadframe 110 and carrier film 410 are provided in the form of a reel of tape-shaped material layer, with carrier film 410 having a thin layer of adhesive applied to one side of the material layer. The reel forms of leadframe 110 and carrier film 410 can be aligned and joined together by conventional roller-based equipment as the reels are unwound. For thin die, it is possible to use a tape automated bonding (TAB) stripe, which can provide both carrier film 410 and leadframe 110 together in an assembled form. In this case, the leads of the TAB film may be configured to provide leads 114, and the die 120 is attached on the surface of carrier film with a thin coat of adhesive by pick and place equipment. As another approach, it is possible to assemble semiconductor dice 120 with carrier film 410, and thereafter assemble leadframe 110 with carrier film 410 and dice 120. This assembly approach requires more precise alignment of the leadframe with the carrier film.

Figure 9:
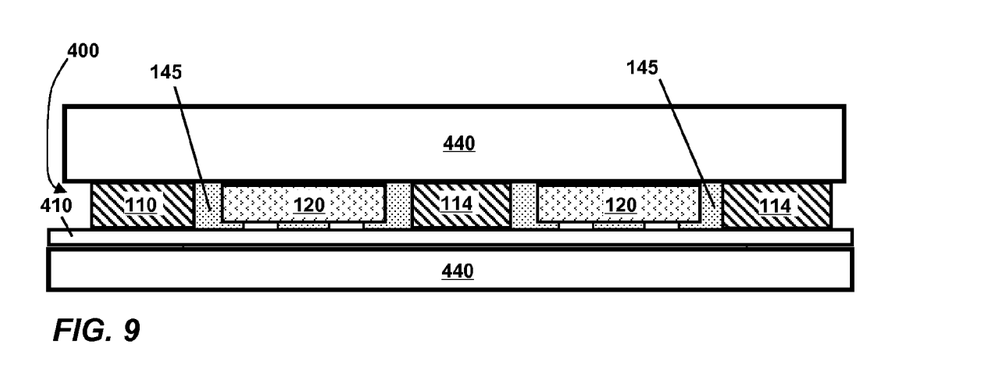

Referring to FIG. 9, the exemplary method further comprises disposing a body 145 of an electrically insulating material within the at least one gap 140 such that the body solidifies and adheres to semiconductor die 120 and at least one lead 114. The action may be readily accomplished by placing assembly 400 in a mold tool 440 that has an upper element, which may have a cavity that encloses dice 120 and leadframe 110, and a lower element, which may comprise a flat plate. Body 145 of insulating material may be injected into gap 140 in liquid form before or after the elements of mold tool 440 have been placed in contact with assembly 400, and allowed to solidify (such as by cooling, heating, chemical reaction, and/or exposure to ultraviolet light, depending upon the properties of the material). Any known molding materials, molders, and molding methods may be used. The body of insulating material may also be disposed into gap 140 using any known encapsulant printing method, which is similar to screen-printing.

Figure 10:
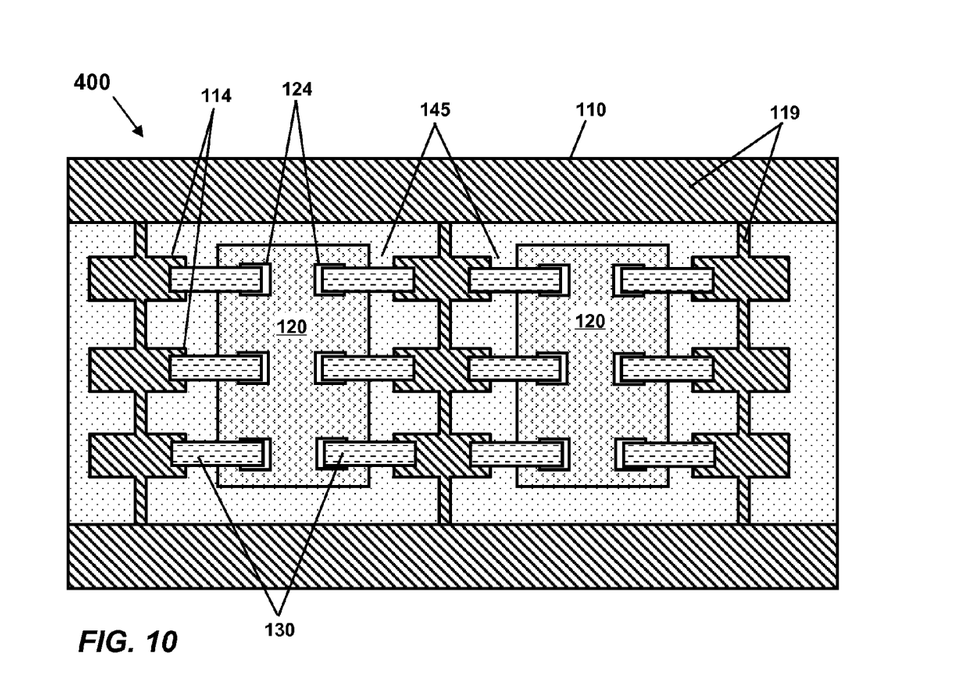

After disposing body 145 of electrically insulting material, the exemplary method further comprises removing carrier film 410 from assembly 400, and forming conductive members 130 at the first surfaces of dice 120 and leadframe 110, as shown in FIG. 10. Conductive members 130 may be formed in a number of ways. As a first way, a temporary plating mask may be screen-printed or otherwise affixed to the assembly's front surface, where the plating mask has apertures at the locations of members 130. Thereafter, a metal may be electrolessly plated onto the assembly's front surface, filling the apertures and forming conductive members 130. The plating mask may then be removed by conventional methods. As another way, a metal may be electrolessly plated onto the assembly's front surface without a plating mask. Thereafter, an etch mask may be screen-printed onto the locations of conductive members 130, and the assembly may then be exposed to an etching solution that removes the plated material not covered by the etching mask, thus leaving conductive member 130. The etching mask may thereafter be removed, or it may be left in place. As yet another way, a conductive adhesive material may be screen-printed onto the locations of conductive members 130, and thereafter processed to form members 130, such as by heating, exposure to ultra violet light, and/or chemical reaction. As yet another way, wire bonds and/or ribbon bonds with low height may be bonded between conductive regions 124 of die 120 and leads 114. As one preference, but not as any requirement, wire bonds may be used to interconnect data and control signals, and ribbon bonds may be used to interconnect power lines. Other known ways of forming conductive members 130 may be also used.

Figure 11:
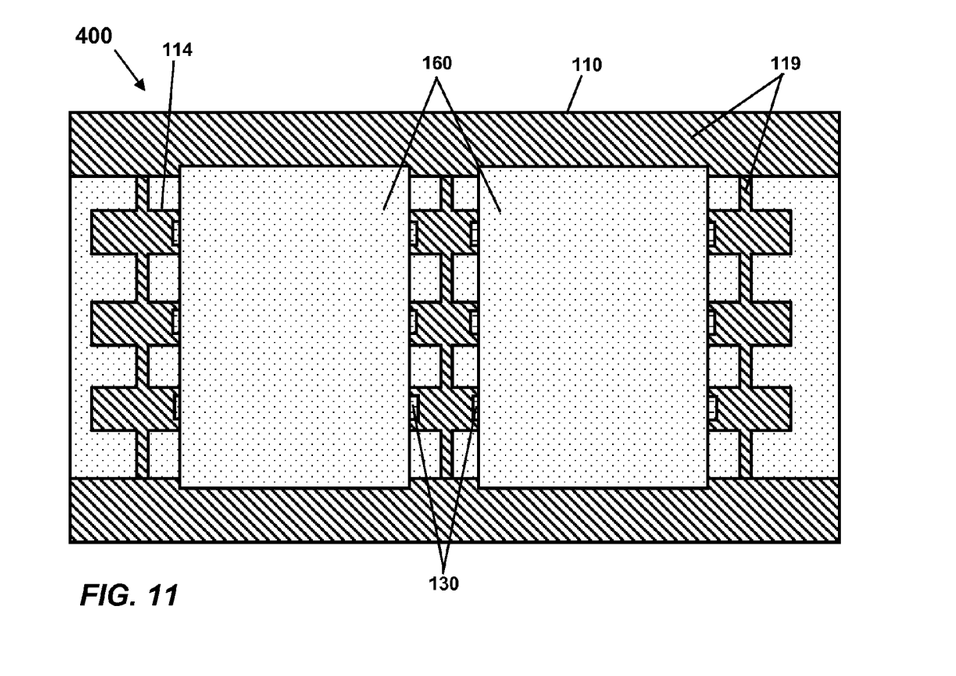

After forming conductive members 130, the exemplary method comprises disposing a layer 160 of electrically insulating material over conductive members 130 and the top surface of assembly 400, as shown in FIG. 11. Layer 160 may be disposed by applying a solid film with an adhesive surface, by spray-coating, by screen-printing, and/or by any other known layer deposition process. Packages 100 may then be separated from assembly 400 by cutting along tie bars 19. Any known cutting tool, such as a laser and/or saw, may be used.

Figure 12:
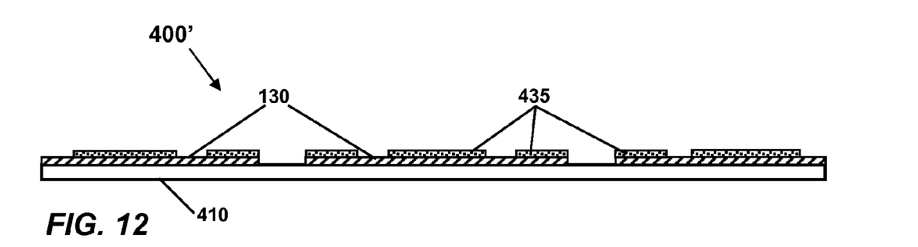
Figure 13:
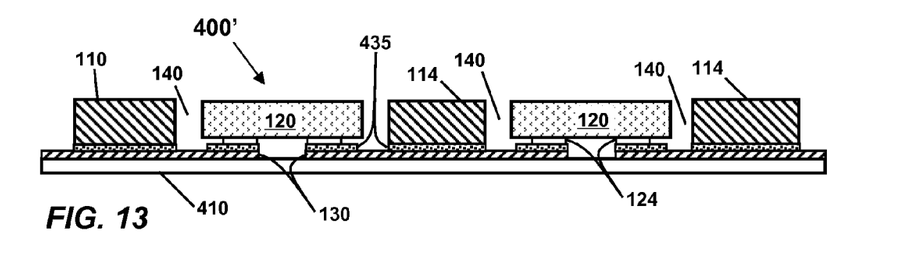
Figure 14:
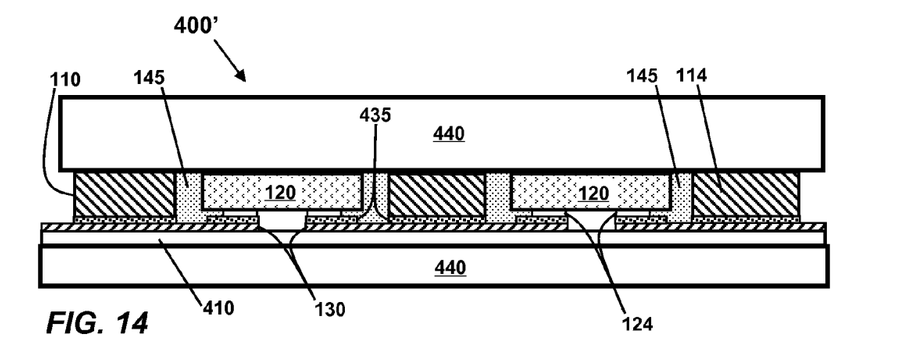

FIGS. 12-14 illustrate another exemplary method of making packages 100, 100a, and 100b. In this exemplary method, conductive members 130 are assembled with carrier film 410 in an assembly 400' before the semiconductor dice 120 and leadframe 110 are assembled with carrier film 410, as shown in FIG. 12. Conductive members 130 may be assembled by disposing a layer of conductive material on a surface of carrier film 410, such as by plating or sheet lamination, followed by pattern etching. The conductive material may comprise copper. Conductive members 130 may also be assembled with carrier film 410 by mounting conductive stripes directly onto a tacky surface of carrier film 410 using pick and place equipment. The conductive stripes may have a thickness of around 25 microns, which would be suitable for power semiconductor applications. As shown in FIG. 12, bodies 435 of an adhesive material may be disposed on the exposed surfaces of conductive members 130. Adhesive bodies 435 may comprise a solder material, and can facilitate the electrical coupling of conductive members 130 to the conductive regions 124 of dice 120 and the leads 114 of leadframe 110. However, it is possible that other bonding processes may be used which would not need adhesive bodies.

As shown in FIG. 13, the exemplary method further comprises assembling leadframe 110 and dice 120 with carrier film 410 and conductive members 130. The assembly of components 110 and 120 may occur in any order, with portions of leads 114 and conductive regions of dice 120 contacting respective bodies 435 of adhesive material. Adhesive bodies 435 may then be treated to adhere them to conductive members 130, leads 114, and the conductive portions of dice 120. When adhesive bodies 130 comprise solder paste, the treatment may comprise a reflow process wherein the bodies are heated to a reflow temperature and thereafter cooled. When adhesive bodies 130 comprise a conductive polymeric material, the treatment may comprise a chemical reaction, an application of heat to a curing temperature, and/or application of ultraviolet light (such as through carrier film 410).

As shown in FIG. 14, the exemplary method further comprises disposing a body 145 of an electrically insulating material within the at least one gap 140 such that the body solidifies and adheres to each semiconductor die 120 and at least one lead 114. The action may be readily accomplished by placing assembly 400' in a mold tool 440 that has an upper element, which may have a cavity that encloses dice 120 and leadframe 110, and a lower element, which may comprise a flat plate. Body 145 of insulating material may be injected into gap 140 in liquid form before or after the elements of mold tool 440 have been placed in contact with assembly 400', and allowed to solidify (such as by cooling, heating, chemical reaction, and/or exposure to ultraviolet light, depending upon the properties of the material). Any known molding materials, molders, and molding methods may be used. The body of insulating material may also be disposed into gap 140 using any known encapsulant printing method, which is similar to screen-printing.

After disposing body 145 of electrically insulating material, the packages may be separated from assembly 400' in final form. In this exemplary method, insulating layer 160 may be provided by carrier film 410.

Figure 15:
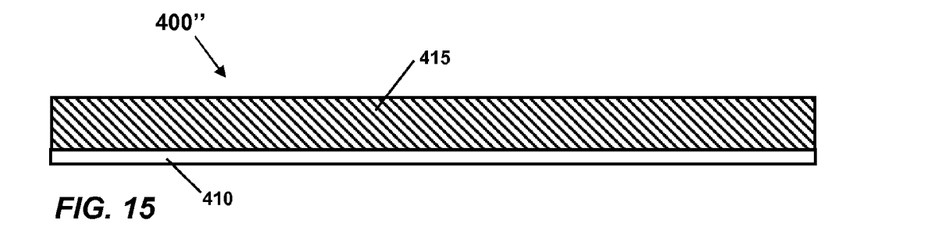
Figure 16:
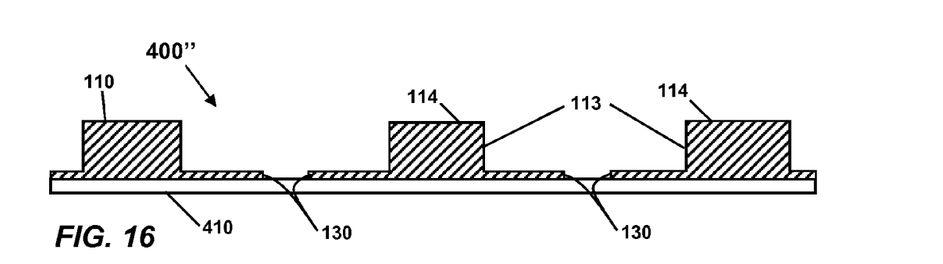
Figure 17:
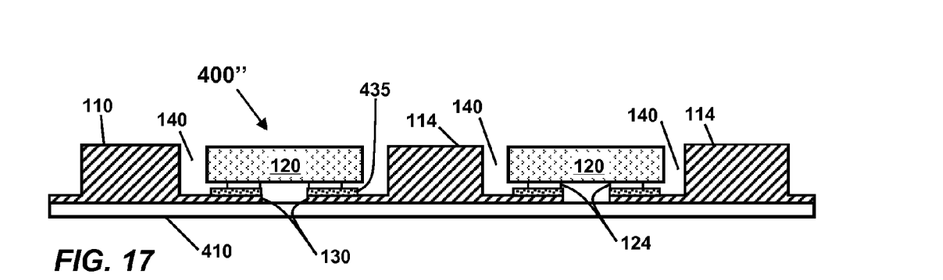

FIGS. 15-17 illustrate another exemplary method of making packages 100, 100a, and 100b. In this exemplary method, conductive members 130 and leadframe 110 are integrally formed and assembled with carrier film 410 substantially at the same time. As used herein, the term "integrally formed" means that the conductive members 130 and at least some portions of the leads 114 of leadframe 110 are formed from at least one common body of material. Referring to FIG. 15, a layer 415 of conductive material, such as copper, is disposed on carrier film 410, such as by film lamination or a combination of electroless plating and electrolytic plating, to provide a starting assembly 400". Referring to FIG. 16, conductive layer 415 is patterned to form conductive members 130, leadframe 110, and leads 114. Two pattern etching steps may be used: one to define leads 114, and another to define conductive members 130. When conductive layer 415 is disposed by plating, the plating and patterning actions may be interleaved. For example, an electroless plating process may be performed to form the layer from which conductive members 130 and the initial thickness of leads 114 and leadframe 110 will be formed; then a pattern mask may be disposed on the electroless layer to define the locations where leads 114 and leadframe 110 will be formed. An electrolytic plating process may then be performed through the pattern mask to form the remaining thicknesses of leads 114 and leadframe 110. That mask may be removed, and an etch mask may be disposed over the electroless layer to define a pattern for the conductive members 130 and the initial thicknesses of leads 114 and leadframe 110 in the electroless layer. The masked structure may then be etched to fully define the conductive members 130 and the initial thicknesses of leads 114 and leadframe 110 from the electroless layer, thereby integrally forming conductive members 130 and the initial thicknesses of leads 114 and leadframe 110 from a common body of material (e.g., the electroless layer).

As shown in FIG. 17, the exemplary method further comprises disposing adhesive bodies 435 on portions of conductive members 130, and assembling dice 120 with carrier film 410, conductive members 130, and leadframe 110, with the conductive regions 124 of dice 120 contacting respective adhesive bodies 435. Adhesive bodies 435 may then be treated to adhere them to conductive members 130 and the conductive portions of dice 120, as described above.

Figure 18:
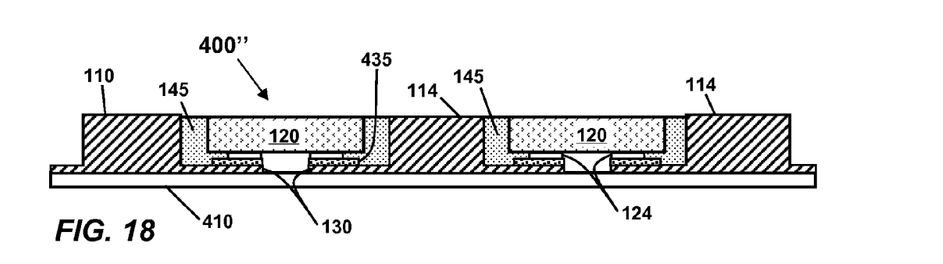

This exemplary method further comprises disposing a body 145 of an electrically insulating material within the at least one gap 140 such that the body solidifies and adheres to each semiconductor die 120 and at least one lead 114. The action may be readily accomplished by placing assembly 400" in a mold tool 440 like that shown in FIG. 14, and injecting electrically insulating material into gap 140 in liquid form, before or after the elements of mold tool 440 have been placed in contact with assembly 400", and allowing the material to solidify (such as by cooling, heating, chemical reaction, and/or exposure to ultraviolet light, depending upon the properties of the material). Any known molding materials, molders, and molding methods may be used. The body of insulating material may also be disposed into gap 140 using any known encapsulant printing method, which is similar to screen-printing. The resulting assembly 400" is shown in FIG. 18.

After disposing body 145 of electrically insulating material, the packages may be separated from assembly 400" in final form. In this exemplary method, insulating layer 160 may be provided by carrier film 410.

Thus, it should be understood that carrier film 410, leadframe 110, semiconductor dice 120, and conductive members 130 may be assembled together in a variety of time sequences, including substantially simultaneous assembly of some components. Accordingly, it should be understood that where the performance of an action of any of the methods disclosed and claimed herein is not predicated on the completion of another action, the actions may be performed in any time sequence (e.g., time order) with respect to one another, including simultaneous performance and interleaved performance of various actions. (Interleaved performance may, for example, occur when parts of two or more actions are performed in a mixed fashion.) Accordingly, it may be appreciated that, while the method claims of the present application recite sets of actions, the method claims are not limited to the order of the actions listed in the claim language, but instead cover all of the above possible orderings, including simultaneous and interleaving performance of actions and other possible orderings not explicitly described above, unless otherwise specified by the claim language (such as by explicitly stating that one action proceeds or follows another action).

The semiconductor die packages described above can be used in electrical assemblies including circuit boards with the packages mounted thereon. They may also be used in systems such as phones, computers, etc. It may be appreciated that more than one semiconductor die may be assembled within each aperture 113 of leadframe 110 to provide greater functionality and circuit density.

Some of the examples described above are directed to "leadless"-type packages such as MLP-type packages (molded leadless packages) where the terminal ends of the leads do not extend past the lateral edges of the molding material. Embodiments of the invention may also include leaded packages where the leads extend past the lateral surfaces of the molding material.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

While the present invention has been particularly described with respect to the illustrated embodiments, it will be appreciated that various alterations, modifications, adaptations, and equivalent arrangements may be made based on the present disclosure, and are intended to be within the scope of the invention and the appended claims.

What is claimed is:

1. A method of making a package having a semiconductor die, the semiconductor die having a front surface with a plurality of conductive regions and a back surface, the method comprising:
    constructing an assembly that has at least one semiconductor die disposed on a carrier film with its front surface facing the carrier film, a plurality of leads disposed adjacent to the at least one semiconductor die, and at least one gap between the semiconductor die and at least one lead;
    disposing a body of an electrically insulating material within the at least one gap such that the body solidifies and adheres to the at least one semiconductor die and the at least one lead;
    separating the semiconductor die and the plurality of leads from the carrier film; and
    forming at least one conductive member having a first end electrically coupled to a conductive region of the semiconductor die and a second end electrically coupled to a lead, wherein forming at least one conductive member comprises plating conductive material.

2. The method of claim 1, wherein plating conductive material comprises electrolessly plating conductive material.

3. The method of claim 1, wherein the body of electrically insulating material is further disposed such that it forms a first surface at the carrier film and a second surface opposite to the first surface, and such that at least one of said plurality of leads has a first surface exposed at the first surface formed by the body of electrically insulating material and a second surface exposed at the second surface formed by the body of electrically insulating material.

4. The method of claim 1, wherein disposing the body of electrically insulating material comprises encapsulant printing.

5. The method of claim 1, wherein at least one conductive member is formed over a surface of one of said plurality of leads such that said at least one conductive member leaves a portion of the surface of said one of said plurality of leads exposed.

6. A method of making a package having a semiconductor die, the semiconductor die having a front surface with a plurality of conductive regions and a back surface, the method comprising:
    constructing an assembly that has at least one semiconductor die disposed on a carrier film with its front surface facing the carrier film, a plurality of leads disposed adjacent to the at least one semiconductor die, and at least one gap between the semiconductor die and at least one lead;
    disposing a body of an electrically insulating material within the at least one gap such that the body solidifies and adheres to the at least one semiconductor die and the at least one lead;
    separating the semiconductor die and the plurality of leads from the carrier film; and
    forming at least one conductive member having a first end electrically coupled to a conductive region of the semiconductor die and a second end electrically coupled to a lead, wherein forming at least one conductive member comprises printing conductive material.

7. A method of making a package having a semiconductor die, the semiconductor die having a front surface with a plurality of conductive regions and a back surface, the method comprising:
    constructing an assembly that has at least one semiconductor die disposed on a carrier film with its front surface facing the carrier film, a plurality of leads disposed adjacent to the at least one semiconductor die, and at least one gap between the semiconductor die and at least one lead;
    disposing a body of an electrically insulating material within the at least one gap such that the body solidifies and adheres to the at least one semiconductor die and the at least one lead;
    separating the semiconductor die and the plurality of leads from the carrier film; and
    forming at least one conductive member having a first end electrically coupled to a conductive region of the semiconductor die and a second end electrically coupled to a lead, wherein forming at least one conductive member comprises bonding at least one of a wire bond or a ribbon bond.

8. A method of making a package having a semiconductor die, the semiconductor die having a front surface with a plurality of conductive regions and a back surface, the method comprising:
constructing an assembly that has at least one semiconductor die disposed on a carrier film with its front surface facing the carrier film, a plurality of leads disposed adjacent to the at least one semiconductor die, and at least one gap between the semiconductor die and at least one lead; and
disposing a body of an electrically insulating material within the at least one gap such that the body solidifies and adheres to the at least one semiconductor die and the at least one lead; and
wherein constructing the assembly comprises disposing the semiconductor chip on a film carrier that has leads disposed thereon.

9. The method of claim 8 wherein the film carrier comprises a tape-automated bonding film.

10. The method of claim 8, wherein the body of electrically insulating material is further disposed such that it forms a first surface at the carrier film and a second surface opposite to the first surface, and such that at least one of said plurality of leads has a first surface exposed at the first surface formed by the body of electrically insulating material and a second surface exposed at the second surface formed by the body of electrically insulating material.

11. The method of claim 8, wherein disposing the body of electrically insulating material comprises encapsulant printing.

12. The method of claim 8, wherein at least one conductive member is formed over a surface of one of said plurality of leads such that said at least one conductive member leaves a portion of the surface of said one of said plurality of leads exposed.

13. A method of making a package having a semiconductor die, the semiconductor die having a front surface with a plurality of conductive regions and a back surface, the method comprising:
constructing an assembly that has at least one semiconductor die disposed on a carrier film with its front surface facing the carrier film, a plurality of leads disposed adjacent to the at least one semiconductor die, and at least one gap between the semiconductor die and at least one lead; and
disposing a body of an electrically insulating material within the at least one gap such that the body solidifies and adheres to the at least one semiconductor die and the at least one lead; and
wherein constructing the assembly comprises forming a plurality of conductive members on the carrier film, and thereafter assembling leads and the at least one semiconductor die onto the conductive members and the carrier film such that at least one conductive member has a first end electrically coupled to a conductive region of the semiconductor die and a second end electrically coupled to a lead.

14. A method of making a package having a semiconductor die, the semiconductor die having a front surface with a plurality of conductive regions and a back surface, the method comprising:
constructing an assembly that has at least one semiconductor die disposed on a carrier film with its front surface facing the carrier film, a plurality of leads disposed adjacent to the at least one semiconductor die, and at least one gap between the semiconductor die and at least one lead; and
disposing a body of an electrically insulating material within the at least one gap such that the body solidifies and adheres to the at least one semiconductor die and the at least one lead; and
wherein constructing the assembly comprises integrally forming a plurality of leads and a plurality of conductive members on the carrier film such that each conductive member has a first end electrically coupled to at least one lead and a second end; and
thereafter assembling the at least one semiconductor die onto a plurality of the conductive members such that at least one conductive member has a second end electrically coupled to a conductive region of the semiconductor die.

* * * * *